(12) United States Patent  (10) Patent No.: US 7,791,362 B2
Hagihara  (45) Date of Patent: Sep. 7, 2010

(54) INSPECTION APPARATUS

(75) Inventor: Junichi Hagihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 89 days.

(21) Appl. No.: 12/333,644

(22) Filed: Dec. 12, 2008

(65) Prior Publication Data

US 2009/0153170 A1 Jun. 18, 2009

(30) Foreign Application Priority Data

Dec. 14, 2007 (JP) .............................. 2007-322865

(51) Int. Cl.
*G01R 31/02* (2006.01)
(52) U.S. Cl. ...................................... 324/758; 324/760
(58) Field of Classification Search .............. 324/158.1, 324/750–758, 760–765; 414/265; 165/247
See application file for complete search history.

(56) References Cited

U.S. PATENT DOCUMENTS 7,180,317 B2 * 2/2007 Hollman ...................... 324/760

7,554,321 B2 * 6/2009 Holt et al. ................. 324/158.1

* cited by examiner

*Primary Examiner*—Minh N Tang
*Assistant Examiner*—Trung Q Nguyen
(74) *Attorney, Agent, or Firm*—Oblon, Spivak, McClelland, Maier & Neustadt, L.L.P.

(57) ABSTRACT

An inspection apparatus includes a movable mounting table having a temperature control device, an elevation drive unit for vertically moving the mounting table, a controller for controlling the elevation drive unit and a probe card having probes arranged above the mounting table. The elevation drive unit includes first and second driving shafts connected to each other through coupling members to drive the mounting table, a motor for driving the first and second driving shafts, and a torque detection unit for detecting a torque between the first and second driving shafts based on a contact load between the probes and the at least one device. The controller includes a torque controller for controlling the torque based on detection results of the torque detection unit when the probe card expands or contracts due to temperature variation.

4 Claims, 5 Drawing Sheets

INSPECTION APPARATUS

FIELD OF THE INVENTION

The present invention relates to an inspection apparatus for inspecting electrical characteristics of an object to be inspected, e.g., a semiconductor wafer; and more particularly, to an inspection apparatus capable of surely performing a high temperature inspection or a low temperature inspection.

BACKGROUND OF THE INVENTION

A conventional inspection apparatus includes, for example, as shown in FIG. 5, a movable mounting table 1 for mounting an object to be inspected (e.g., a semiconductor wafer), a driving unit 2 for horizontally and vertically moving the mounting table 1, a probe card 3 provided above the mounting table 1, an alignment unit 4 for performing a position alignment of probes 3A of the probe card 3 with electrode pads of a semiconductor wafer W mounted on the mounting table 1, and a controller 5 for controlling various components including the mounting table 1 and the alignment unit 4. A position alignment of the electrode pads of the semiconductor wafer W mounted on the mounting table 1 with the probes 3A of the probe card 3 is performed under control of the controller 5 such that the electrode pads are made to be in contact with the probes 3A. Then, the semiconductor wafer W is overdriven to inspect electrical characteristics of the semiconductor wafer W by a specific contact load.

The driving unit 2 includes a servo motor for driving an XY stage and a stepping motor forming an elevation drive unit for vertically moving the mounting table 1. The alignment unit 4 includes a first camera 4A for imaging the semiconductor wafer W mounted on the mounting table 1, a second camera 4B for imaging the probes 3A of the probe card 3, and image processing parts 4C and 4D for processing images obtained by the first and second cameras 4A and 4B, respectively. The position alignment is performed based on the images of the electrode pads of the semiconductor wafer W and the probes 3A of the probe card 3. Further, in FIG. 5, a reference numeral '4E' designates an alignment bridge.

For example, when a high temperature inspection is performed on the semiconductor wafer W, the semiconductor wafer W mounted on the mounting table 1 is heated to a temperature of, e.g., 150° C. by using a temperature control device embedded in the mounting table 1 and an alignment of the electrode pads of the semiconductor wafer W mounted on the mounting table 1 with the probes 3A of the probe card 3 is performed by using the alignment unit 4. The mounting table 1 is moved up by using the elevation drive unit having the stepping motor such that the electrode pads are made to be in contact with the probes 3A. Then, the semiconductor wafer W is overdriven such that the electrode pads are made to be in electrical contact with the probes 3A with a specific contact load. Then, the electrical characteristics of the semiconductor wafer W are inspected at the high temperature of 150° C.

In the initial step of the inspection, the semiconductor wafer W is heated to the high temperature of 150° C., but the probe card 3 is not heated. Accordingly, there is a large temperature difference between the semiconductor wafer W and the probes 3A. Thus, when the probes 3A are made to be in contact with the electrode pads of a first device of the semiconductor wafer W in the inspection, the probes 3A are heated directly by the semiconductor wafer W mounted on the mounting table 1 and thermally expanded. Further, a main body of the probe card 3 is also gradually heated and thermally expanded by heat dissipated from the semiconductor wafer W. The temperatures of the main body and the probes 3A of the probe card 3 gradually rise while the inspection is repeatedly performed on the devices of the semiconductor wafer W. The probes 3A are extended from a state shown in FIG. 6A or a state represented by a fine line in FIG. 6B to a state represented by a solid line in FIG. 6B, and tip positions of the probes 3A are gradually lowered from their initial positions. Accordingly, if the semiconductor wafer W is overdriven by a predetermined overdrive amount through the stepping motor, the contact load between the probes 3A and the semiconductor wafer W exceeds an appropriate contact load, resulting in a worrisome possibility of damaging the probes 3A or the electrode pads P. Further, it takes a long time until the probe card 3 is thermally expanded and the tip positions of the probes 3A are stabilized.

As a result, when a high temperature inspection is performed, the probe card is preheated and completely thermally expanded in advance to stabilize its dimension before the high temperature inspection is performed. However, as the size of the probe card increases, time required for preheating becomes long, for example, 20 to 30 minutes. Accordingly, for example, in a technology disclosed in Japanese Patent Laid-open Publication No. 2007-088203, the probes are made to be in direct contact with the semiconductor wafer set at a high temperature in the inspection, and the probe card is preheated from the vicinity of the probe card.

However, in the technology disclosed in the Publication, the probe card is hardly thermally expanded during the high temperature inspection, and the probe is made to be in contact with the semiconductor wafer with a stable contact load by overdriving the semiconductor wafer, thereby preventing the probe card or the semiconductor wafer from being damaged. However, since preheating time of the probe card is required in addition to inspection time, there has been a problem that the inspection time becomes long by the preheating time. Further, if the probe card is not preheated, the tip positions of the probes 3A are lowered during the inspection as described above to cause an excessive contact load, resulting in a worrisome possibility of damaging the devices of the semiconductor wafer W or the probe card 3.

SUMMARY OF THE INVENTION

In view of the above, the present invention provides an inspection apparatus capable of performing an inspection with high reliability by detecting a contact load on a real time basis through an elevation drive unit to maintain an appropriate contact load although a high temperature inspection is performed without preheating a probe card and tip positions of a probe are changed, and capable of preventing the probe card or an object to be inspected from being damaged.

In accordance with an embodiment of the present invention, there is provided an inspection apparatus which includes a movable mounting table having a temperature control device, an elevation drive unit for vertically moving the mounting table, a controller for controlling the elevation drive unit and a probe card having probes arranged above the mounting table, wherein an object to be inspected mounted on the mounting table is heated or cooled to a predetermined temperature through the temperature control device, and at least one device among devices formed in the object is made to be in electrical contact with the probes of the probe card with a specific contact load to inspect electrical characteristics of the device, the inspection apparatus comprising: first and second driving shafts connected to each other through coupling members to drive the mounting table, a motor for driving the first and second driving shafts, and a torque detection unit for detecting a torque between the first driving shaft and the second driving shaft based on a contact load between the probes and the at least one device, which are included in the elevation drive unit; and a torque controller, included in the controller, for controlling the torque based on detection results of the torque detection unit when the probe card expands or contracts due to temperature variation.

Further, in the inspection apparatus, the torque detection unit may include a torque detection part interposed between the coupling members, a torsion angle detector for detecting a torsion angle of the torque detection part, and a torque detector for detecting a torque of the torque detection part based on the torsion angle detected by the torsion angle detector.

Further, in the inspection apparatus, the torque detection unit may include a torque detection part interposed between the coupling members, a first encoder for detecting a rotation angle of the first driving shaft provided on a side close to the motor, a second encoder for detecting a rotation angle of the second driving shaft, and an angle difference detector for acquiring a difference between the rotation angles detected by the first and second encoders.

Further, in the inspection apparatus, the torque detection unit may further include a micro linear scale for detecting a rotation angle of the second driving shaft, and the second encoder detects the rotation angle detected by the micro linear scale.

In the inspection apparatus in accordance with the present invention, it is possible to perform an inspection with high reliability by detecting a contact load on a real time basis through an elevation drive unit to maintain an appropriate contact load although a high temperature inspection is performed without preheating a probe card and tip positions of a probe are changed, and also possible to prevent the probe card or an object to be inspected from being damaged.

BRIEF DESCRIPTION OF THE DRAWINGS

The above features of the present invention will become apparent from the following description of embodiments given in conjunction with the accompanying drawings, in which:

FIGS. 3A and 3B are partially enlarged views showing states in which the semiconductor wafer mounted on a mounting table is made to be in contact with a probe card to perform a high temperature inspection, wherein FIG. 3A is a cross sectional view showing a state right after making the contact and FIG. 3B is a cross sectional view showing a state in which the probe card is thermally expanded and the semiconductor wafer is moved down;

FIGS. 6A and 6B are partially enlarged views showing states in which the semiconductor wafer is made to be in contact with the probe card to perform a high temperature inspection by using the inspection apparatus of FIG. 5, wherein FIG. 6A is a cross sectional view showing a state right after making the contact and FIG. 6B is a cross sectional view showing a state in which the probe card is thermally expanded.

DETAILED DESCRIPTION OF THE EMBODIMENTS

Hereinafter, embodiments of the present invention will be described in detail with reference to FIGS. 1 to 4.

Figure 1:
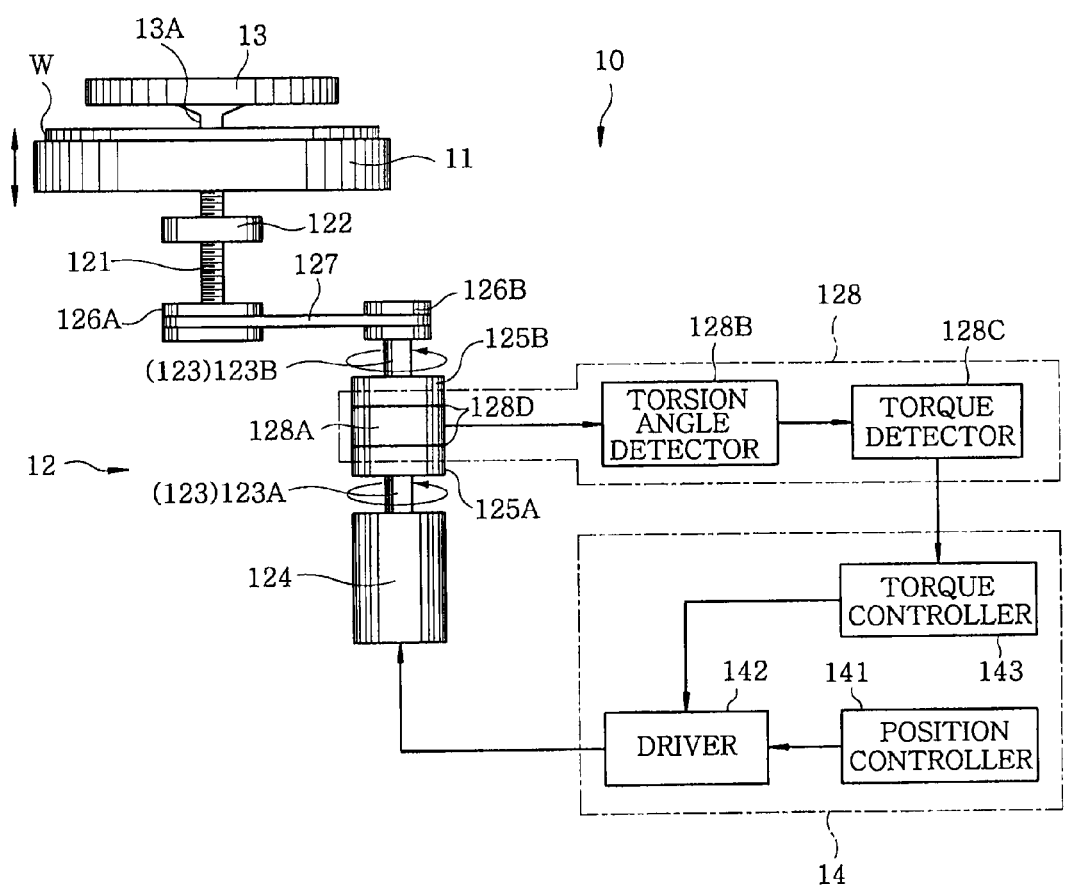
FIG. 1 illustrates a configuration of main parts of an inspection apparatus in accordance with an embodiment of the present invention.

An inspection apparatus 10 in accordance with an embodiment of the present invention includes, for example, as shown in FIG. 1, a mounting table 11 which mounts an object to be inspected (e.g., semiconductor wafer) W thereon and has a temperature control device (not shown) therein to control a temperature of the semiconductor wafer W, an XY stage (not shown) for horizontally moving the mounting table 11, an elevation drive unit 12 for vertically moving the mounting table 11, a probe card 13 provided above the mounting table 11, and an alignment unit (not shown) for aligning probes 13A of the probe card 13 with electrode pads of the semiconductor wafer W mounted on the mounting table 11. The semiconductor wafer W mounted on the mounting table 11 is controlled to be maintained at a predetermined temperature (e.g., 150° C.) under control of a controller 14. Then, the semiconductor wafer W mounted on the mounting table 11 is overdriven such that the probes 13A are made to be in electrical contact with the electrode pads of the semiconductor wafer W with a specific contact load. Thereafter, a high temperature inspection is performed on the semiconductor wafer W.

As shown in FIG. 1, the elevation drive unit 12 includes a ball screw 121 extended from a central bottom portion of the mounting table 11, a nut 122 screwed to the ball screw 121, driving shafts 123 for rotating the ball screw 121, and a stepping motor 124 for rotating the driving shafts 123. The driving shafts 123 include a first driving shaft 123A provided at a side close to the stepping motor 124 and a second driving shaft 123B provided at a side close to the ball screw 121. The first and second driving shafts 123A and 123B are connected to each other by coupling members 125A and 125B. The ball screw 121 and the second driving shaft 123B are connected to each other by an endless belt 127 wound around respective pulleys 126A and 126B. Accordingly, when the ball screw 121 is rotated by the stepping motor 124 through the driving shafts 123, the mounting table 11 is moved up through the ball screw 121 and the nut 122.

Further, as shown in FIG. 1, the controller 14 includes a position controller 141 for performing a position control via the stepping motor 124, and a driver 142 for driving the stepping motor 124 based on a control signal transmitted from the position controller 141. The position controller 141 performs a position control via the stepping motor 124 such that the mounting table 11 is moved up to a predetermined position. Accordingly, the electrode pads of the semiconductor wafer W mounted on the mounting table 11 are made to be in contact with the probes 13A of the probe card 13 with a specific contact load. Then, the high temperature inspection is performed on the semiconductor wafer W.

However, for example, while the high temperature inspection is performed on the semiconductor wafer W, the probe card 13 is thermally expanded due to contact with the heated semiconductor wafer W and heat dissipated from the semiconductor wafer W as described above. Accordingly, tip positions of the probes 13A of the probe card 13 are changed by thermal expansion. In this case, if the semiconductor wafer W mounted on the mounting table 11 is overdriven to a predetermined position by a position control through the stepping motor 124, a contact load between the electrode pads and the probes 13A exceeds an appropriate contact load, resulting in a worrisome possibility of damaging the probe card 13 and/or the semiconductor wafer W. Thus, a torque detection unit 128 for detecting a torque of the stepping motor 124 is provided at the elevation drive unit 12 in this embodiment, so that a contact load between the probes 13A and the electrode pads of the semiconductor wafer W is maintained at an appropriate contact load in the high temperature inspection by the torque detection unit 128.

As shown in FIG. 1, the torque detection unit 128 includes a torque detection part 128A interposed between the coupling members 125A and 125B to generate a torsion corresponding to a torque applied to the driving shafts 123, a torsion angle detector 128B for detecting a torsion angle of the torque detection part 128A, and a torque detector 128C for detecting a current torque between the first and second driving shafts 123A and 123B based on the torsion angle detected by the torsion angle detector 128B. A current torque signal detected by the torque detector 128C is amplified by an amplifier (not shown) and is transmitted to the controller 14. Further, leaf springs 128D are attached to upper and lower sides of the torque detection part 128A. The leaf springs 128D are fastened to the coupling members 125A and 125B.

When the mounting table 11 is moved up by driving the stepping motor 124, a contact load is generated between the electrode pads of the semiconductor wafer W mounted on the mounting table 11 and the probes 13A. Accordingly, a braking force is applied to the second driving shaft 123B, and a torsion is generated in the torque detection part 128A interposed between the first and second driving shafts 123A and 123B. A torsion angle is detected from a difference between rotation amounts of the leaf springs 128D provided at the upper and lower sides of the torque detection part 128A. For instance, an encoder may be used as the torsion angle detector 128B.

The elevation drive unit 12 in accordance with the embodiment of the present invention has the torque detection unit 128 having the same configuration. Accordingly, conventionally, when a high temperature inspection is performed on the semiconductor wafer W, the probes 13A are thermally expanded due to its contact with the electrode pads, and a contact load between the probes and the electrode pads exceeds an appropriate contact load. However, in this embodiment, the torque detection unit 128 always monitors a current torque caused by the contact load to thereby maintain an appropriate contact load as will be described later. Thus, the high temperature inspection can be performed with high reliability.

That is, the controller 14 includes a torque controller 143, which controls a current torque through the stepping motor 124 based on the torque signal received from the torque detector 128C of the torque detection unit 128. The torque controller 143 includes a storage part for storing, as a reference torque signal, a torque signal detected by the torque detector 128C when the probes 13A are initially made to be in contact with the electrode pads, and a difference counter for calculating a difference between a reference torque signal and a current torque signal detected by the torque detector 128C in the inspection. The torque controller 143 transmits a torque control signal obtained based on the calculation results of the difference counter to a driver 142, thereby restoring a current torque to a reference torque through the stepping motor 124. Further, the torque controller 143 calculates a current contact load based on the torque signal and transmits the current contact load to a display unit so that the current contact load is displayed on the display unit. In the elevation drive unit 12 in accordance with this embodiment, the stepping motor 124 can have a torque control function by adding the torque detection unit 128 to the previously installed stepping motor 124. Thus, the elevation drive unit 12 in accordance with this embodiment can employ the previously installed stepping motor 124 through reformation.

Next, an operation of the inspection apparatus in accordance with this embodiment will be described with reference to FIGS. 2A, 2B and 3. First, the mounting table 11 is heated under control of the controller 14 to a specific temperature at which the semiconductor wafer W is maintained at a temperature of, e.g., 150° C. When the semiconductor wafer W is mounted on the mounting table 11, while the mounting table 11 moves horizontally, the alignment unit performs an alignment of the electrode pads of the semiconductor wafer W mounted on the mounting table 11 with the probes 13A of the probe card 13. In this case, the temperature of the semiconductor wafer W mounted on the mounting table 11 is set to be kept at 150° C.

Figure 2A:
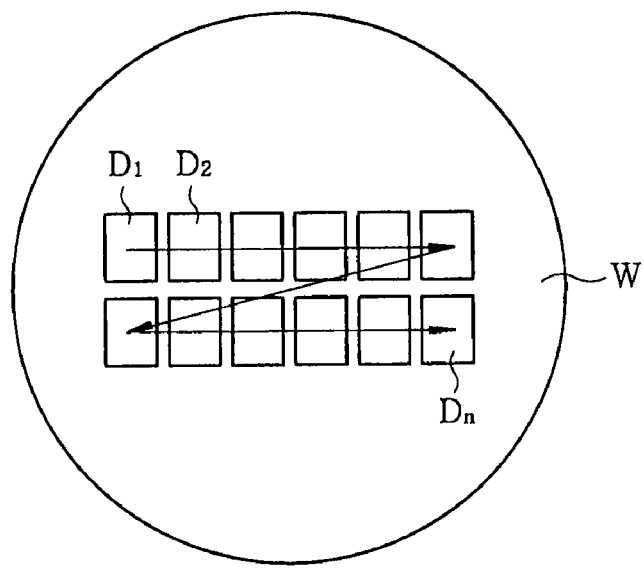
FIG. 2A is a plan view for explaining an index transfer of a semiconductor wafer and FIG. 2B is a graph showing a relationship between inspection time and a torque applied to a stepping motor.
Figure 2B:
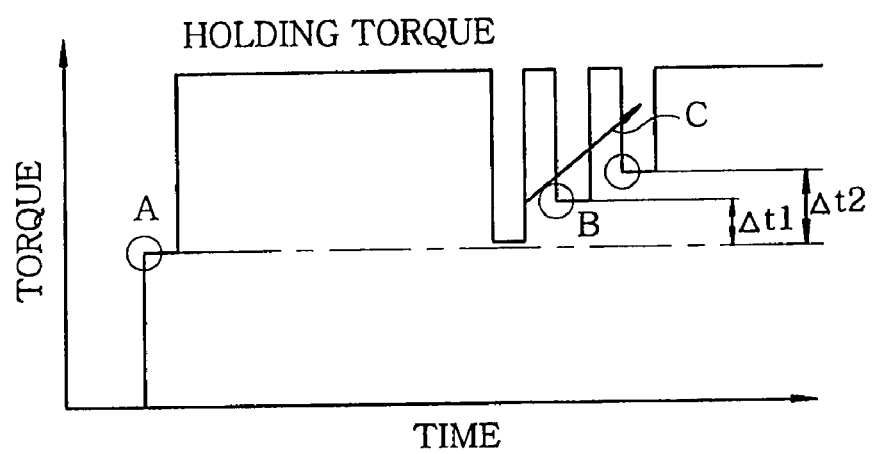
Figure 3A:
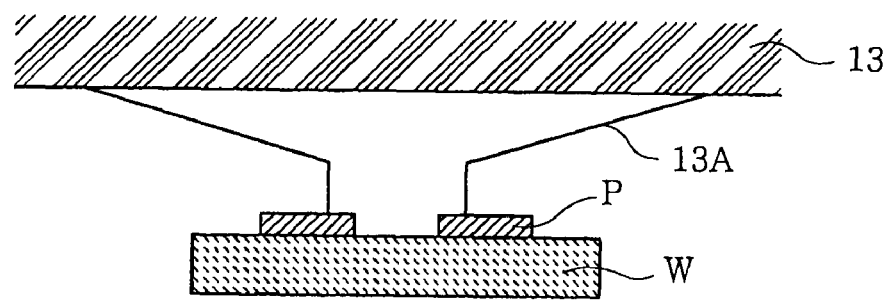
Figure 3B:
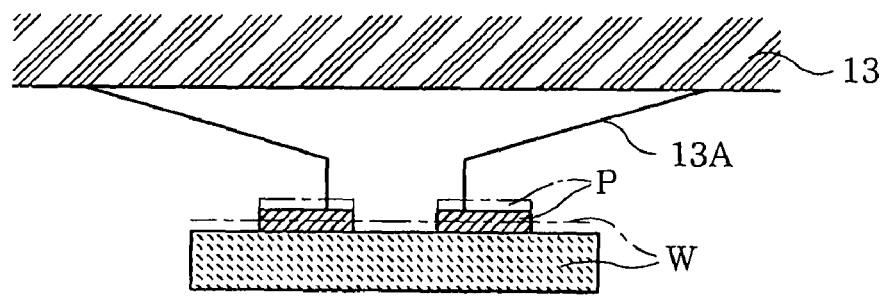

Then, the controller 14 moves the mounting table 11 in a horizontal direction via the XY stage and stops the mounting table 11 when a device $D_1$ which is a first inspection target, as shown in FIG. 2A, among a plurality of devices D of the semiconductor wafer W mounted on the mounting table 11 reaches a position right under the probes 13A of the probe card 13. Subsequently, the controller 14 transmits a position control signal from the position controller 141 to the driver 142 to rotate the stepping motor 124 through the driver 142. The stepping motor 124 rotates the ball screw 121 through the driving shaft 123, the pulley 126B, the endless belt 127 and the pulley 126A, thereby moving the mounting table 11 upward through the nut 122. The mounting table 11 is moved up based on the position control signal from the position controller 141. As shown in FIG. 2A, electrode pads of the first device $D_1$ of the semiconductor wafer W mounted on the mounting table 11 are made to be in contact with the probes 13A. The torque of the stepping motor 124 becomes larger than a non-contact torque by the contact load. As the torque is changed by the contact load, a torsion is generated in the torque detection part 128A between the first driving shaft 123A and the second driving shaft 123B of the driving shaft 123. The torsion angle detector 128B detects a torsion angle and transmits a detection signal to the torque detector 128C. The torque detector 128C acquires a current torque based on a detection signal from the torsion angle detector 128B as indicated by A in FIG. 2B. Then, the torque detector 128C transmits a torque signal to the torque controller 143 of the controller 14 through the amplifier (not shown).

The torque controller 143 stores the torque of the first device as a reference torque in the storage part based on the torque signal from the torque detector 128C. Since the torque is obtained right after the semiconductor wafer W is made to be in contact with the probes 13A, the reference torque is a torque corresponding to an appropriate contact load in the high temperature inspection without any influence caused by thermal expansion on the probes 13A before thermal expansion of the probe card 13 starting. Subsequently, the mounting table 11 is overdriven and a high temperature inspection is performed on the first device. Then, the stepping motor 124 rotates backward and stops under control of the controller 14. The mounting table 11 moves down to a rise starting position (reference position). The mounting table 11 moves horizontally in a lowered state, so that the semiconductor wafer W is index-moved as represented by an arrow in FIG. 2A.

Subsequently, the stepping motor 124 is driven based on the control signal from the position controller 141 of the controller 14. The mounting table 11 moves up from the reference position such that electrode pads of a second device $D_2$ of the semiconductor wafer W are made to be in contact with the probes 13A. The electrode pads of the second device $D_2$ are made to be in contact with the probes 13A by a new contact load. The new contact load becomes larger than the appropriate contact load of the first device $D_1$ by the thermal expansion of the probe card 13. In the torque detection unit 128, the torque detection part 128A is twisted by the new contact load. The torsion angle detector 128B detects a torsion angle of the torque detection part 128A. The torque detector 128C detects a torque based on the torsion angle as indicated by B in FIG. 2B and transmits a torque signal to the torque controller 143.

In the torque controller 143, the difference counter calculates a difference $\Delta t_1$ between the current torque and the reference torque stored in the storage part. The torque controller 143 controls the driver 142 on a real time basis based on the torque difference. The stepping motor 124 rotates backward such that the mounting table 11 is moved down from a position represented by a dashed dotted line to a position represented by a solid line in FIG. 3B. Consequently, it is always possible to restore a current torque to a reference torque, thereby maintaining an appropriate contact load. Thus, the electrode pads of the second device $D_2$ are made to be in contact with the probes 13A by an appropriate contact load. The high temperature inspection of the device $D_2$ can be surely performed without damaging the device $D_2$ or the probe card 13.

When a high temperature inspection is performed on a third device $D_3$, the probe card 13 is further thermally expanded and the tip positions of the probes 13A are closer to the semiconductor wafer W. Accordingly, a contact load between the electrode pads of the third device $D_3$ and the probes 13A cannot be prevented from being increased only by controlling the stepping motor 124 based on the control signal of the position controller 141. However, in this embodiment, as shown in FIG. 2B, the difference counter of the torque controller 143 monitors a difference $\Delta t_2$ between the current torque and the reference torque and the driver 142 is controlled based on the torque difference. Thus, the high temperature inspection can always be reliably performed by restoring the contact load to an appropriate contact load. As described above, since the stepping motor 124 can control the torque with the torque detection unit 128, although the contact load increases due to the thermal expansion of the probe card 13, as indicated by an arrow C in FIG. 2B, a pull-out torque of the stepping motor 124 also gradually increases and the stepping motor 124 is surely operated without step-out.

As described above, in this embodiment, the elevation drive unit 12 for vertically moving the mounting table 11 includes the first and second driving shafts 123A and 123B connected to each other through the coupling members 125A and 125B, the stepping motor 124 for driving the first and second driving shafts 123A and 123B, and the torque detection unit 128 for detecting a torque between the first driving shaft 123A and the second driving shaft 123B based on a contact load between the probes 13A and the electrode pads of the device D. The controller 14 includes a position controller 141 for performing a position control of the stepping motor 124, and a torque controller 143 for controlling a torque based on the detection results of the torque detection unit 128 when the probe card 13 expands due to temperature variation. Thus, although a high temperature inspection is performed without preheating the probe card 13 and tip positions are changed due to thermal expansion of the probes 13A, the torque controller 143 of the controller 14 rotates the stepping motor 124 backward based on a torque signal transmitted from the torque detection unit 128 on a real time basis, so that the mounting table 11 is moved down to absorb the expansion of the probes 13A. Accordingly, a high temperature inspection can be performed with high reliability by restoring the contact load between the probes 13A and the semiconductor wafer W to an appropriate contact load, thereby preventing the semiconductor wafer W or the probe card 13 from being damaged.

Figure 4:
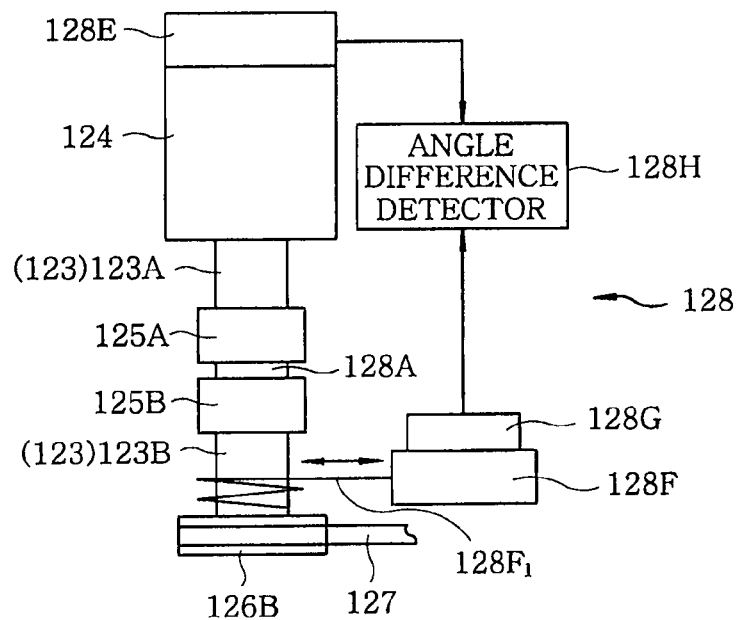
FIG. 4 illustrates a configuration of main parts of an inspection apparatus in accordance with another embodiment of the present invention.
Figure 5:
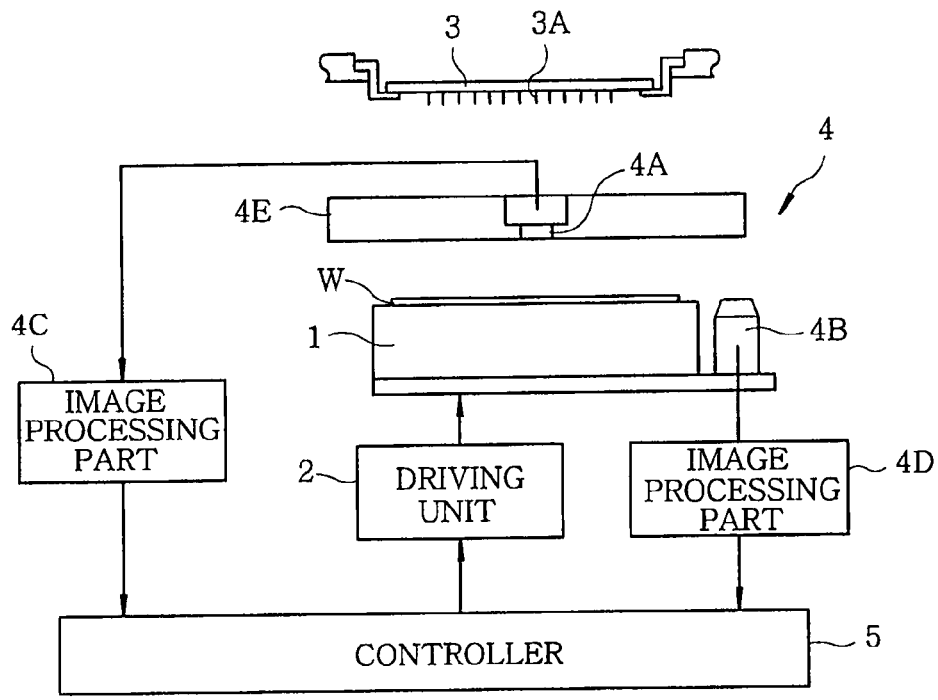
FIG. 5 schematically shows an example of a conventional inspection apparatus.
Figure 6A:
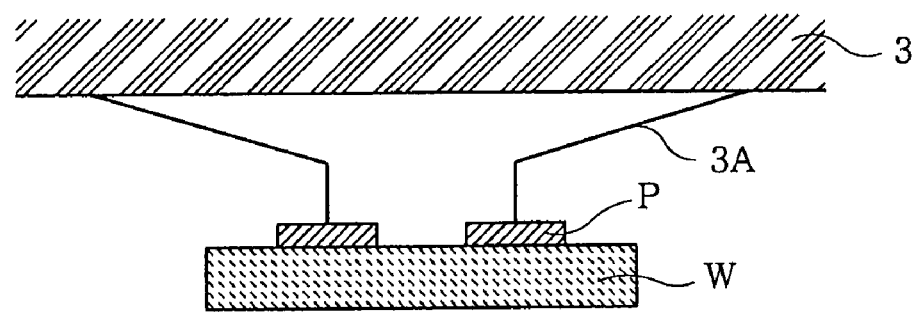
Figure 6B:
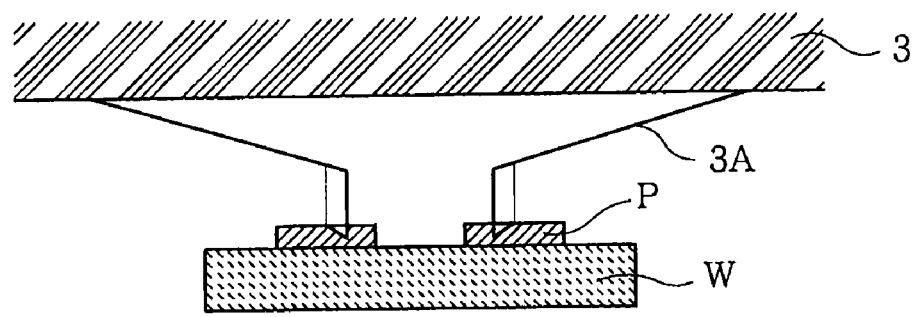

FIG. 4 illustrates a stepping motor and a torque detection unit serving as main parts in accordance with another embodiment of the present invention. An inspection apparatus of this embodiment has the same configuration as that of the above embodiment except the torque detection unit. Thus, the same or like parts in this embodiment as those in the above embodiment are designated by the same reference numerals.

In this embodiment, as shown in FIG. 4, driving shafts 123 of a stepping motor 124 includes first and second driving shafts 123A and 123B connected to each other through coupling members 125A and 125B. A torque detection part 128A is interposed between the coupling members 125A and 125B. Further, a first encoder 128E is mounted on the stepping motor 124 and a wire $128F_1$ of a micro linear scale 128F is wound around the second driving shaft 123B. The micro linear scale 128F is formed integrally with a second encoder 128G. The second encoder 128G acquires a rotation angle of the second driving shaft 123B based on a wound length of the wire $128F_1$ of the micro linear scale 128F. Further, an angle difference detector 128H optically detects a difference between a rotation angle acquired by the first encoder 128E on a side close to the stepping motor 124 and a rotation angle acquired by the second encoder 128G on a side close to the micro linear scale 128F. That is, in this embodiment, a torque detection unit 128 includes the torque detection part 128A, the first and second encoders 128E and 128G, and the angle difference detector 128H.

Thus, when a high temperature inspection is performed on the semiconductor wafer in a state where the probe card is thermally expanded, the torque detection part 128A between the first and second driving shafts 123A and 123B is twisted by the contact load between the probes and the electrode pads of the device on the mounting table. At this time, the angle difference detector 128H acquires a difference between a detection angle of the first encoder 128E and a detection angle of the second encoder 128G and transmits the angle difference to the torque controller of the controller. Accordingly, the mounting table is moved down as in the above embodiment such that the contact load between the probes and the electrode pads of the device is restored to an appropriate contact load. As a result, a high temperature inspection of the devices can be surely performed with high reliability without damaging the device or the probe card.

As described above, in accordance with this embodiment, torque detection unit 128 includes the torque detection part 128A, the first encoder 128E for detecting a rotation angle of the first driving shaft 123A on the side close to the stepping motor 124, the second encoder 128G for detecting a rotation angle of the second driving shaft 123B on the side close to the mounting table, and the angle difference detector 128H for acquiring a rotation angle difference between the first and second encoders 128E and 128G. Accordingly, when the angle difference detector 128H transmits a detection signal of a rotation angle difference to the torque controller 143, the torque controller 143 operates the driver 142 based on the detection signal such that the mounting table is moved down to restore the torque to a reference torque. Thus, a high temperature inspection can be performed on the devices with an appropriate contact load. The torque detection unit 128 has the micro linear scale 128F for detecting a rotation angle of the second driving shaft 123B, and the second encoder 128G precisely detects the rotation angle of the second driving shaft 123B detected by the micro linear scale 128F, thereby controlling the contact load with high precision.

Further, the present invention is not limited to the above embodiments and the components of the present invention can be appropriately modified. For instance, although a torsion angle of the torque detection part is detected by an encoder in the above embodiment, the torque can be detected by using a torsion gauge. Further, although a high temperature inspection of the semiconductor wafer is described in the above embodiments, the present invention can be applied to a low temperature inspection of the semiconductor wafer. Further, the present invention can be applied to other objects to be inspected in addition to the semiconductor wafer.

The present invention may be applied to an inspection apparatus for performing a high temperature inspection or a low temperature inspection on an object to be inspected such as a semiconductor wafer.

While the invention has been shown and described with respect to the embodiments, it will be understood by those skilled in the art that various changes and modifications may be made without departing from the scope of the invention as defined in the following claims.

What is claimed is:

1. An inspection apparatus which includes a movable mounting table having a temperature control device, an elevation drive unit for vertically moving the mounting table, a controller for controlling the elevation drive unit and a probe card having probes arranged above the mounting table, wherein an object to be inspected mounted on the mounting table is heated or cooled to a predetermined temperature through the temperature control device, and at least one device among devices formed in the object is made to be in electrical contact with the probes of the probe card with a specific contact load to inspect electrical characteristics of the device, the inspection apparatus comprising:

first and second driving shafts connected to each other through coupling members to drive the mounting table, a motor for driving the first and second driving shafts, and a torque detection unit for detecting a torque between the first driving shaft and the second driving shaft based on a contact load between the probes and the at least one device, which are included in the elevation drive unit; and a torque controller, included in the controller, for controlling the torque based on detection results of the torque detection unit when the probe card expands or contracts due to temperature variation.

2. The inspection apparatus of claim 1, wherein the torque detection unit includes a torque detection part interposed between the coupling members, a torsion angle detector for detecting a torsion angle of the torque detection part, and a torque detector for detecting a torque of the torque detection part based on the torsion angle detected by the torsion angle detector.

3. The inspection apparatus of claim 1, wherein the torque detection unit includes a torque detection part interposed between the coupling members, a first encoder for detecting a rotation angle of the first driving shaft provided on a side close to the motor, a second encoder for detecting a rotation angle of the second driving shaft, and an angle difference detector for acquiring a difference between the rotation angles detected by the first and second encoders.

4. The inspection apparatus of claim 3, wherein the torque detection unit further includes a micro linear scale for detecting a rotation angle of the second driving shaft, and the second encoder detects the rotation angle detected by the micro linear scale.

* * * * *